United States Patent
Tomoi

(10) Patent No.: US 11,202,142 B2
(45) Date of Patent: Dec. 14, 2021

(54) VIBRATION GENERATION SYSTEM, SIGNAL GENERATOR, AND VIBRATOR DEVICE

(71) Applicant: JVCKENWOOD Corporation, Kanagawa (JP)

(72) Inventor: Yutaka Tomoi, Yokohama (JP)

(73) Assignee: JVCKENWOOD CORPORATION, Yokohama (JP)

( * ) Notice: Subject to any disclaimer, the term of this patent is extended or adjusted under 35 U.S.C. 154(b) by 0 days.

(21) Appl. No.: 16/906,030

(22) Filed: Jun. 19, 2020

(65) Prior Publication Data

US 2020/0322713 A1 Oct. 8, 2020

Related U.S. Application Data

(63) Continuation of application No. PCT/JP2018/032634, filed on Sep. 3, 2018.

(30) Foreign Application Priority Data

Jan. 16, 2018 (JP) .............................. JP2018-004895

(51) Int. Cl.
| | |
|---|---|
| *H03G 5/00* | (2006.01) |
| *H04R 1/26* | (2006.01) |
| *B06B 1/02* | (2006.01) |
| *G06F 3/16* | (2006.01) |
| *H03G 3/30* | (2006.01) |

(Continued)

(52) U.S. Cl.
CPC ............. *H04R 1/26* (2013.01); *B06B 1/0207* (2013.01); *G06F 3/165* (2013.01); *H03G 3/30* (2013.01); *H04R 1/025* (2013.01); *H04R 3/04* (2013.01); *H04R 2400/03* (2013.01); *H04R 2420/07* (2013.01)

(58) Field of Classification Search
CPC . H04R 1/26; H04R 1/025; H04R 3/04; H04R 2400/03; H04R 2420/07; B06B 1/0207; G06F 3/165; H03G 3/30
USPC .................................................... 381/98, 99
See application file for complete search history.

(56) References Cited

U.S. PATENT DOCUMENTS

| | | | | |
|---|---|---|---|---|
| 2013/0188804 A1* | 7/2013 | Burgett | ..................... | H03G 3/02 381/74 |
| 2014/0348348 A1* | 11/2014 | Efrati | ..................... | H02K 35/02 381/162 |
| 2017/0372697 A1* | 12/2017 | Cheatham, III | .. | H04L 29/06414 |

FOREIGN PATENT DOCUMENTS

| | | |
|---|---|---|
| CN | 103181198 A | 6/2013 |
| JP | S59-174090 A | 10/1984 |

(Continued)

OTHER PUBLICATIONS

European Extended Search Report from EP Appln. No. 18901539.9 dated Jan. 20, 2021, 8 pages.

(Continued)

*Primary Examiner* — Ammar T Hamid
(74) *Attorney, Agent, or Firm* — Brundidge & Stanger, P.C.

(57) ABSTRACT

A vibrator is fitted to a human body for use. A variable filter extracts a signal of a predefined frequency range from an input music signal. A driving controller drives the vibrator based on the signal of the frequency range extracted by the variable filter. It is possible to adjust the frequency range that is predefined by using a user operation interface. The frequency range that is predefined may be determined by a frequency determination interface.

8 Claims, 8 Drawing Sheets

(51) Int. Cl.
*H04R 1/02* (2006.01)
*H04R 3/04* (2006.01)

(56) References Cited

FOREIGN PATENT DOCUMENTS

| | | |
|---|---|---|
| JP | S60-27582 U | 2/1985 |
| JP | H04-77197 A | 3/1992 |
| JP | H6-33752 Y | 8/1994 |
| JP | H07-245793 A | 9/1995 |
| JP | 2008-072165 A | 3/2008 |
| JP | 2013-48870 A | 3/2013 |
| JP | 2013-541264 A | 11/2013 |
| JP | 2016-178627 A | 10/2016 |

OTHER PUBLICATIONS

International Preliminary Report an Patentability from International Application No. PCT/JP2018/032634 dated Jul. 21, 2020, 13 pages.
International Search Report from International Application No. PCT/JP2018/032634 dated Oct. 16, 2018.

\* cited by examiner

VIBRATION GENERATION SYSTEM, SIGNAL GENERATOR, AND VIBRATOR DEVICE

CROSS-REFERENCE TO RELATED APPLICATION

This application is a Continuation of International Application No. PCT/JP2018/032634, filed on Sep. 3, 2018, which in turn claims the benefit of Japanese Application No. 2018-004895, filed on Jan. 16, 2018, the disclosures of which Application is incorporated by reference herein.

BACKGROUND OF THE INVENTION

1. Field

The present invention relates to a vibration generation system, a signal generator, and a vibrator device provided with a vibrator fitted to the human body for use.

2. Description of the Related Art

It is difficult to reproduce powerful deep bass with an earphone or a headphone. To reproduce powerful deep bass, a long-stroke speaker is necessary, and it is difficult to secure a stroke of a speaker in small-sized earphones and headphones such as a canal type earphone.

To address the issue, there is proposed a body vibration headphone in which a vibration unit capable of transforming a low-range signal into mechanical vibration is mounted (see, for example, patent document 1). A body vibration headphone can reproduce an experience of bass or a sense of realism to a certain degree. There is also proposed an acoustic vibrating rod system in which a music signal from a CD player is caused to branch to a music signal for vibration and a music signal for the speaker/earphone, the music signal for vibration is fed to a vibrator, the vibrating rod is vibrated in resonance with the vibration of the vibrator, and the vibration is propagated from the part in contact with the skin (see, for example, patent literature 2).
[Patent Literature 1] JP2016-178627
[Patent Literature 2] JP2013-48870

Merely building a vibrator into a headphone as in case of the above-mentioned body vibration headphone can address personal preferences, express music, or provide a sense of immersion only to a limited degree and so is insufficient to fulfill extensive need for music experience. Similarly, systems like the aforementioned acoustic vibrating rod system that vibrate a vibrating rod in resonance with the vibration of the vibrator have also been insufficient to fulfill extensive need for music experience.

SUMMARY OF THE INVENTION

A vibration generation system according to an embodiment includes: a vibrator fitted to a human body for use; a variable filter that extracts a signal of a predefined frequency range from an input music signal; a driver that drives the vibrator based on the signal of the frequency range extracted by the variable filter; and a user operation interface with which it is possible to adjust the frequency range that is predefined.

Another embodiment relates to a signal generator. The signal generator is connected by wire or wirelessly to a vibrator device including a vibrator fitted to a human body for use and a driver for driving the vibrator, the signal generator including: a variable filter that extracts a signal of a predefined frequency range from a music signal; an output interface that outputs the signal of the frequency range extracted by the variable filter to the vibrator device; and a user operation interface with which it is possible to adjust the frequency range that is predefined.

Still another embodiment relates to a vibrator device. The device is connected by wire or wirelessly to a signal generator including a variable filter that extracts, from a music signal, a signal of a predefined frequency range, an output interface that outputs the signal of the frequency range extracted by the variable filter, and a user operation interface with which it is possible to adjust the frequency range that is predefined, the vibrator device including: a vibrator fitted to a human body for use; an input interface that acquires, from the signal generator, the signal of the frequency extracted by the variable filter; and a driver that drives the vibrator based on the input signal of the frequency range extracted by the variable filter.

Optional combinations of the aforementioned constituting elements, and implementations of the embodiment in the form of methods, apparatuses, systems, and computer programs, etc. may also be practiced as additional modes of the embodiments.

BRIEF DESCRIPTION OF THE DRAWINGS

Embodiments will now be described byway of examples only, with reference to the accompanying drawings which are meant to be exemplary, not limiting and wherein like elements are numbered alike in several Figures in which.

DETAILED DESCRIPTION OF THE PREFERRED EMBODIMENT

The invention will now be described by reference to the preferred embodiments. This does not intend to limit the scope of the present invention, but to exemplify the invention.

Figure 1:
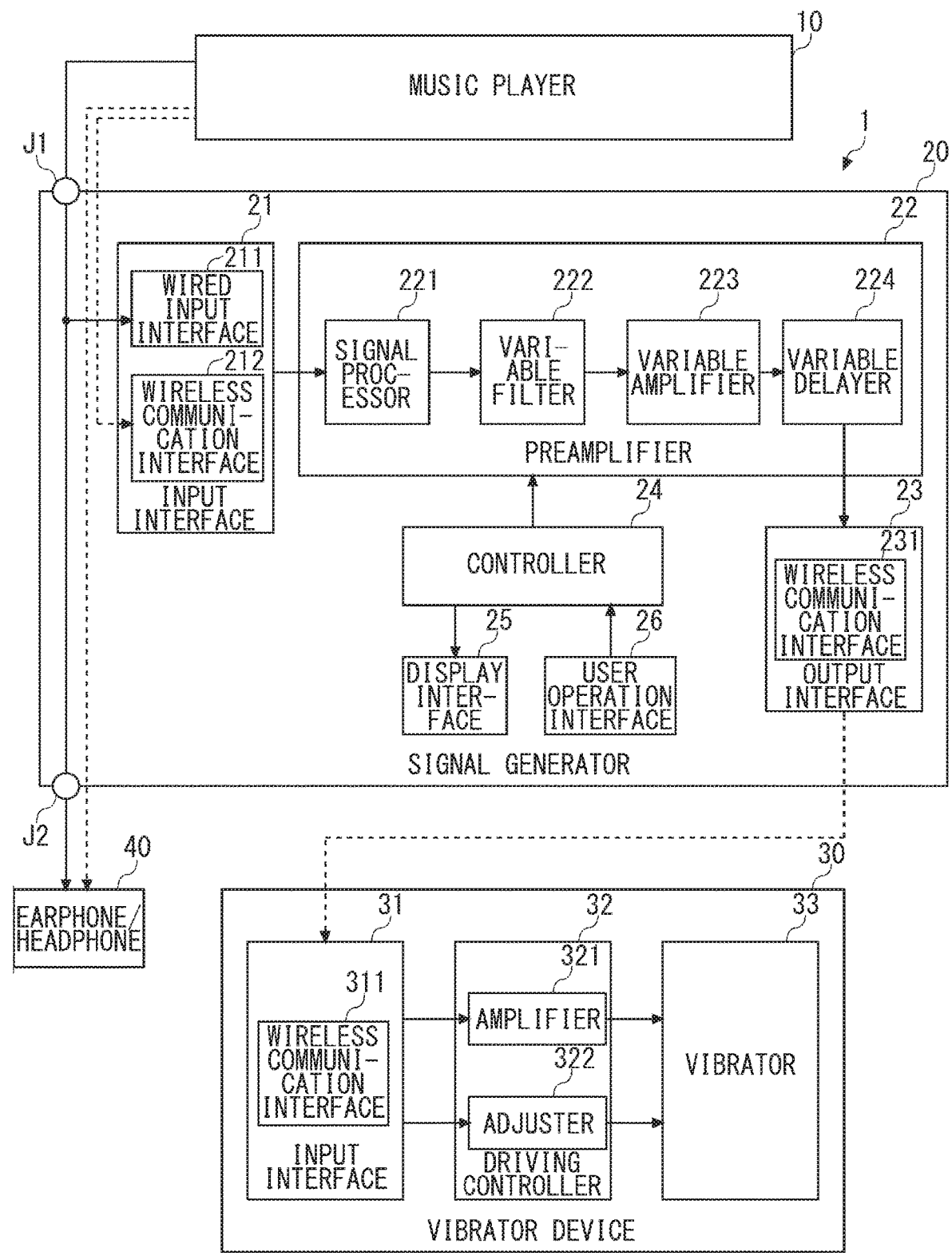
FIG. 1 is a block diagram showing a configuration of a vibration generation system according to an embodiment of the present invention.

FIG. 1 is a block diagram showing a configuration of a vibration generation system. 1 according to an embodiment of the present invention. The vibration generation system 1 is used in combination with an existent music player 10 and an earphone/headphone 40. A smartphone, a digital audio player (DAP), a CD player, etc. can be used as the music player 10. Earphones like an overhead earphone, a canal type earphone, an inner-ear earphone can be used as the earphone/headphone 40. A wireless earphone/headphone 40 can also be used.

The vibration generation system 1 is provided with a signal generator 20 and a vibrator device 30. The signal generator 20 is provided with an input interface 21, a preamplifier 22, an output interface 23, a controller 24, a display interface 25, a user operation interface 26, an input-side phone jack J1, and an output-side phone jack J2. The input interface 21 of the signal generator 20 includes a wired input interface 211 and a wireless communication interface 212.

The signal generator 20 and the music player 10 are connected by wire or wirelessly. In the case they are connected by wire, they are connected by a cable fitted with phone plugs at the respective ends. A phone plug at one end of the cable is inserted into the input-side phone jack J1 of the signal generator 20. In the case the signal generator 20 and the music player 10 are connected wirelessly, they are connected by near field wireless communication (Bluetooth (registered trademark) is assumed in this specification).

The signal line connected to the input-side phone jack J1 branches in the housing of the signal generator 20 and is connected to the output-side phone jack J2 and a wired input interface 211, respectively. The wired input interface 211 acquires a music signal output from the music player 10 and outputs the signal to the preamplifier 22. In the case the music signal is a stereo signal, the wired input interface 211 acquires a left channel signal and a right channel signal from the music player 10. An MP3 sound source, a CD sound source, a high-resolution sound source, etc. can be used as the source of the music signal.

A phone plug of the cable connected to the earphone/headphone 40 can be inserted into the output-side phone jack J2 of the signal generator 20. In this mode of connection, the signal generator 20 imports the music signal input from the music player 10 via the wired input interface 211 and also passes the signal through to the earphone/headphone 40.

The wireless communication interface 212 is provided with an antenna (not shown) and performs a communication process for near field wireless communication via the antenna. Referring to FIG. 1, the wireless communication interface 212 is paired with a wireless communication interface (not shown) of the music player 10, receives the music signal transmitted from the music player 10 by near field wireless communication, and outputs the received signal to the preamplifier 22.

In the case the wireless earphone/headphone 40 is used, the wireless communication interface (not shown) of the earphone/headphone 40 is paired with the wireless communication interface (not shown) of the music player 10, and the music player 10 transmits the music signal to the earphone/headphone 40 by near field wireless communication. The music signal transmitted to the earphone/headphone 40 and the music signal transmitted to the signal generator 20 are basically the same.

FIG. 1 shows an exemplary configuration in which the signal generator 20 can be connected to the music player 10 either by wire or wirelessly. In the case of employing a configuration in which only wired connection is enabled, the wireless communication interface 212 is omitted. In the case of employing a configuration in which only wireless connection is enabled, the wired input interface 211, the input-side phone jack J1, and the output-side phone jack J2 are omitted.

The preamplifier 22 includes a signal processor 221, a variable filter 222, a variable amplifier 223, and a variable delayer 224. The signal processor 221 synthesizes the left channel signal and the right channel signal to generate a monaural signal and outputs the synthesized signal to the variable filter 222. Only one of the left channel signal and the right channel signal may be output to the variable filter 222. In the case a monaural signal is input to the preamplifier 22, the signal processor 221 directly outputs the monaural signal to the variable filter 222. In the case two vibrator 33 including the one for left (L) and the one for right (R), the left channel signal and the right channel signal (stereo signal) are directly output to the variable filter 222. Stereophonic sound is expected to offer an advantage of, for example, duplicating a hall sound in the mid to high range.

The variable filter 222 extracts a signal in a predefined frequency range from the input music signal. The variable filter 222 includes at least one of a low-pass filter, a bandpass filter, and a bypass filter. The low-pass filter, the bandpass filter, and the bypass filter may be comprised of an analog circuit or implemented by digital signal processing. The cutoff frequency of the low-pass filter, the upper cutoff frequency and the lower cutoff frequency of the bandpass filter, and the cutoff frequency of the bypass filter are variable.

In the case the low-pass filter, the bandpass filter, and the bypass filter are comprised of an analog circuit, the respective cutoff frequencies can be adjusted by configuring the constant of the resistance or capacitance to be variable. In the case the low-pass filter, the bandpass filter, and the bypass filter are comprised of a digital filter (e.g., an infinite impulse response (IIR) filter or a finite impulse response (FIR) filter), the respective cutoff frequencies can be adjusted by configuring the sampling period or weight coefficient to be variable.

The variable amplifier 223 amplifies the music signal of the frequency range extracted by the variable filter 222 by a predefined gain. This adjusts the volume (vibration quantity) of the music signal.

The variable delayer 224 delays the music signal subjected to gain control by the variable amplifier 223 by a predefined amount of delay. This adjusts the time difference between the sound wave transmitted from the earphone/headphone 40 to the ear and the vibration transmitted from the vibrator 33 to the human body (bone). The variable delayer 224 may be omitted. In that case, the amount of delay is fixed.

The music signal, for which at least one of the frequency range, volume, and time is adjusted by the preamplifier 22, is output to the output interface 23. The output interface 23 includes a wireless communication interface 231. The wireless communication interface 231 is provided with an antenna (not shown) and performs a communication process for near field wireless communication via the antenna. Referring to FIG. 1, the wireless communication interface 231 is paired with a wireless communication interface 311 of the vibrator device 30 and transmits the music signal adjusted by the preamplifier 22 and range information extracted by the preamplifier 22 to the wireless communication interface 311 by near field wireless communication. The signal generator 20 and the vibrator device 30 may be connected by a wiring cable. In that case, a wired output interface is provided in the signal generator 20 to replace the wireless communication interface 231, and a wired input interface is provided in the vibrator device 30 to replace the wireless communication interface 311.

The controller 24 controls the entirety of the signal generator 20. The controller 24 is comprised of, for example, a microprocessor. The display interface 25 is provided with a display such as a liquid crystal display and an organic EL display and displays the image generated by the controller 24. The user operation interface 26 is provided with a user interface such as a switch, a button, a dial knob, and a touch panel and receives a user operation. The display interface 25 and the user operation interface 26 may be integrated in a touch panel display.

The controller 24 sets a frequency range desired to be extracted in the variable filter 222, sets the gain in the variable amplifier 223, and sets the amount of delay in the variable delayer 224, based on the user operation in the user operation interface 26.

The vibrator device 30 is provided with an input interface 31, a driving controller 32, and a vibrator 33. The input interface 31 includes the wireless communication interface 311. The driving controller 32 includes an amplifier 321 and an adjuster 322. The wireless communication interface 311 is paired with the wireless communication interface 231 of the signal generator 20 and receives the music signal and the range information transmitted from the signal generator 20 by near field wireless communication. The wireless communication interface 311 outputs the music signal to the amplifier 321 and outputs the range information to the adjuster 322.

The vibrator 33 is fitted to an arbitrary position of the human body for use. Any of existent electrodynamic, piezoelectric, electrostatic vibrators may be used as the vibrator 33. It is preferred to use a vibrator with a high response speed from the perspective of reducing the time difference between the sound wave transmitted from the earphone/headphone 40 to the ear and the vibration transmitted from the vibrator 33 to the human body (bone).

The amplifier 321 converts the music signal input from the input interface 31 into a driving signal for the vibrator 33. In the case the electrodynamic vibrator 33 is used, for example, the amplifier 321 converts the music signal into a driving current induced in the coil. In the case the piezoelectric vibrator 33 is used, the amplifier 321 converts the music signal into a voltage applied to the piezoelectric device.

The adjuster 322 adjusts the resonance frequency of the vibrator 33 to an optimum frequency based on the input range information. The adjuster 322 causes, within a range in which the resonance frequency of the vibrator 33 is adjustable, the resonance frequency of the vibrator 33 to approach the central frequency of the range included in the range information and extracted by the preamplifier 22. The adjuster 322 can adjust the resonance frequency of the vibrator 33 by displacing the physical property (e.g., spring constant) of the vibrator 33. Some piezoelectric devices are configured such that the resonance frequency can be adjusted by electrical control. In that case, the resonance frequency of the vibrator 33 can be adjusted by adjusting the voltage.

In the case the vibrator 33 in which the resonance frequency cannot be adjusted is used, the adjuster 322 is omitted. In that case, the resonance frequency of the vibrator 33 is fixed.

The vibration level of the vibrator 33 that can be experienced varies greatly depending on the site of the human body fitted with the vibrator 33. This is considered to be because of the impact of the resonance frequency in bone vibration. According to the study by Dr. Alfred Tomatis, the resonance frequency in bone vibration is higher in the skull bone than in the backbone. The higher up in the backbone from the sacral spine to the lumbar spine, the thoracic spine, and the cervical spine, the higher the resonance frequency. The resonance frequency in the parietal bone is higher in the parietal bone than in the occipital bone. Therefore, the lower in the backbone the vibrator is fitted, the larger the vibration level that can be experienced. This is especially true in the case of low-range vibration. When it is desired to enhance the low range that is difficult to reproduce with the earphone/headphone 40, it is effective to fit the vibrator 33 to the waist. However, few ordinary users have knowledge about the resonance frequency of the bone, and it is desired to provide a user interface that guides the user to the position where the vibrator 33 should be fitted.

Figure 2:
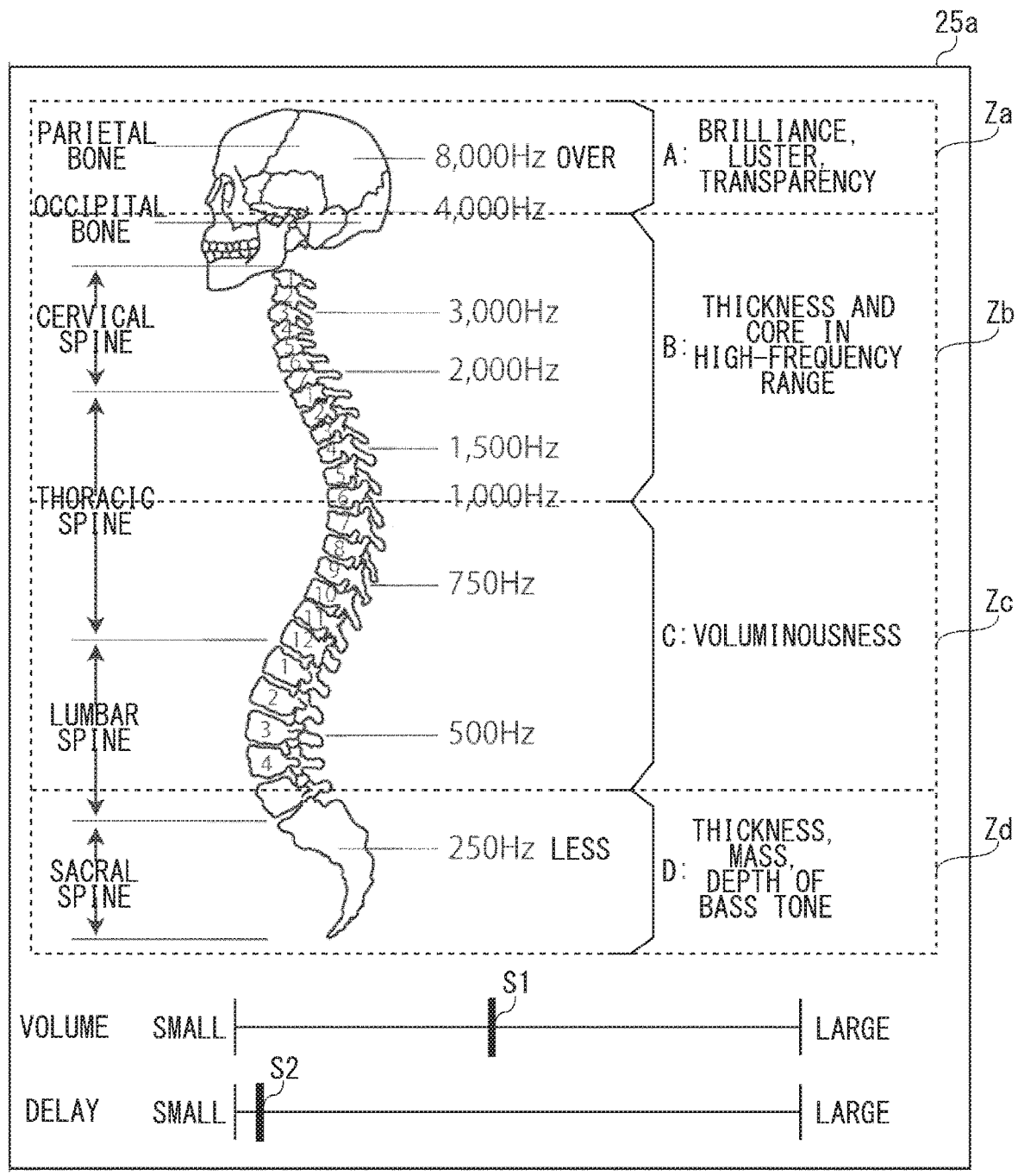
FIG. 2 shows the first example of a user operation screen displayed on the display interface.

FIG. 2 shows the first example of a user operation screen 25a displayed on the display interface 25. The user operation screen 25a shown in FIG. 2 shows correspondence between the frequency range desired to be enhanced by the vibrator 33 and the site of the human body that should be fitted with the vibrator 33. Referring to FIG. 2, the frequency range enhanced by the vibrator 33 is organized into four groups. The characteristic of the sound in each frequency range is expressed by words. FIG. 2 shows that the frequency range is organized into four groups including a range equal to higher than 4 kHz (A range), a range 4 kHz-1 kHz (B range), a range 1 kH-375 Hz (C range), and a range equal to or lower than 375 Hz (D range). The user can select a range desired to be enhanced from the four ranges.

Referring to FIG. 2, the sound in the A range is expressed as being characterized by brilliance, luster, and transparency. It is indicated that the vibrator 33 should be fitted to a position corresponding to the upper part of the skull bone when the A range is selected. The sound in the B range is expressed as being characterized by thickness and core in the high-range. It is indicated that the vibrator 33 should be fitted to a position corresponding to the range between the lower part of the skull bone and the center of the breastbone when the B range is selected. The sound in the C range is expressed as being characterized by voluminousness. It is indicated that the vibrator 33 should be fitted to a position corresponding to the range between the center of the breastbone and the lower end of the hip bone when the C range is selected. The sound in the D range is expressed as being characterized by thickness, mass, depth of bass tone. It is indicated that the vibrator 33 should be fitted to a position corresponding to the range between the lower end of the hip bone and the lower end of the sacral spine when the D range is selected.

The user can select the A range by touching a zone Za in the user operation screen 25a corresponding to the A range, select the B range by touching a zone Zb corresponding to the B range, select the C range by touching a zone Zc corresponding to the C range, and select the D range by touching a zone Zd corresponding to the D range.

The user operation screen 25a shows a volume adjustment bar for adjusting the volume of vibration of the vibrator 33 and a delay adjustment bar for adjusting the amount of delay in the vibrational output from the vibrator 33 relative to the sound wave output from the earphone/headphone 40. The user can adjust the volume of vibration of the vibrator 33 by controlling a slide bar S1 on the volume adjustment slide bar and can adjust the amount of delay of vibrational output of the vibrator 33 by controlling a slide bar S2 on the delay adjustment bar.

Figure 3:
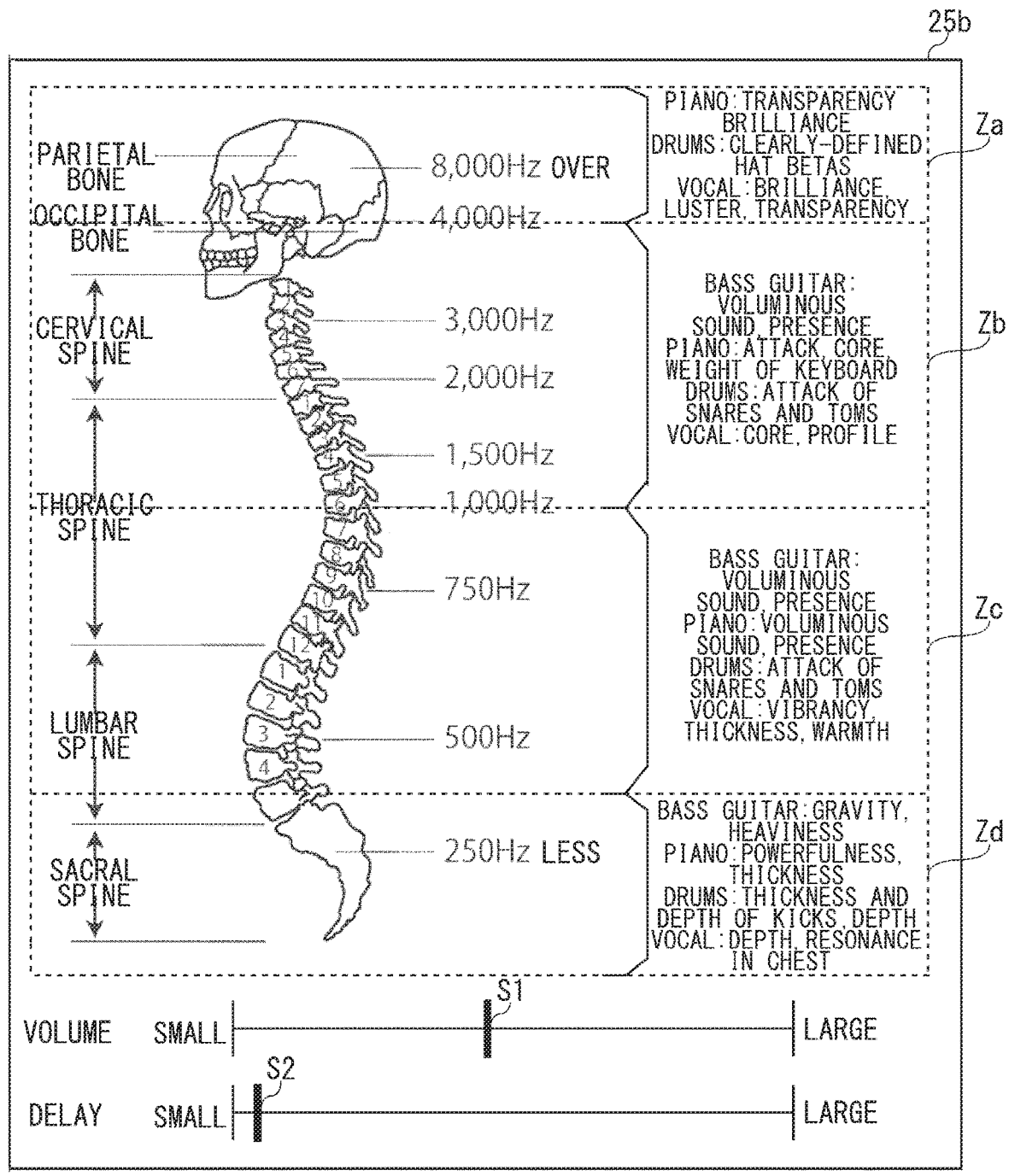
FIG. 3 shows the second example of a user operation screen displayed on the display interface.

FIG. 3 shows the second example of a user operation screen 25b displayed on the display interface 25. In the user operation screen 25b shown in FIG. 3, the frequency range enhanced by the vibrator 33 is organized into four groups. The characteristic of the sound of musical instruments and the sound of vocal performance in each frequency range is expressed by words.

Referring to FIG. 3, the sound in the A range is characterized by expressing the sound of piano as being characterized by transparency and brilliance, the sound of drums as being characterized by clearly-defined hat beats, and the sound of vocal performance as being characterized by brilliance, luster, and transparency. The sound in the B range is characterized by expressing the sound of a bass guitar as being characterized by voluminous sound and presence, the sound of piano as being characterized by attack, core, weight of the keyboard, and the sound of drums as being characterized by attack of snares and toms, and the sound of vocal performance as being characterized by core and profile. The sound in the C range is characterized by expressing the sound of a bass guitar as being characterized by voluminous sound and presence, the sound of piano as being characterized by voluminous sound and presence, the sound of drums as being characterized by attack of snares and toms, and the sound of vocal performance as being characterized by vibrancy, thickness, and warmth. The sound in the D range is characterized by expressing the sound of a bass guitar as being characterized by gravity and heaviness, the sound of piano as being characterized by powerfulness and thickness, the sound of drums as being characterized by thickness and depth of kicks, and the sound of vocal performance as being characterized by depth, and resonance in the chest. The other parts of the display are the same as those of the user operation screen 25a of FIG. 2.

Figure 4:
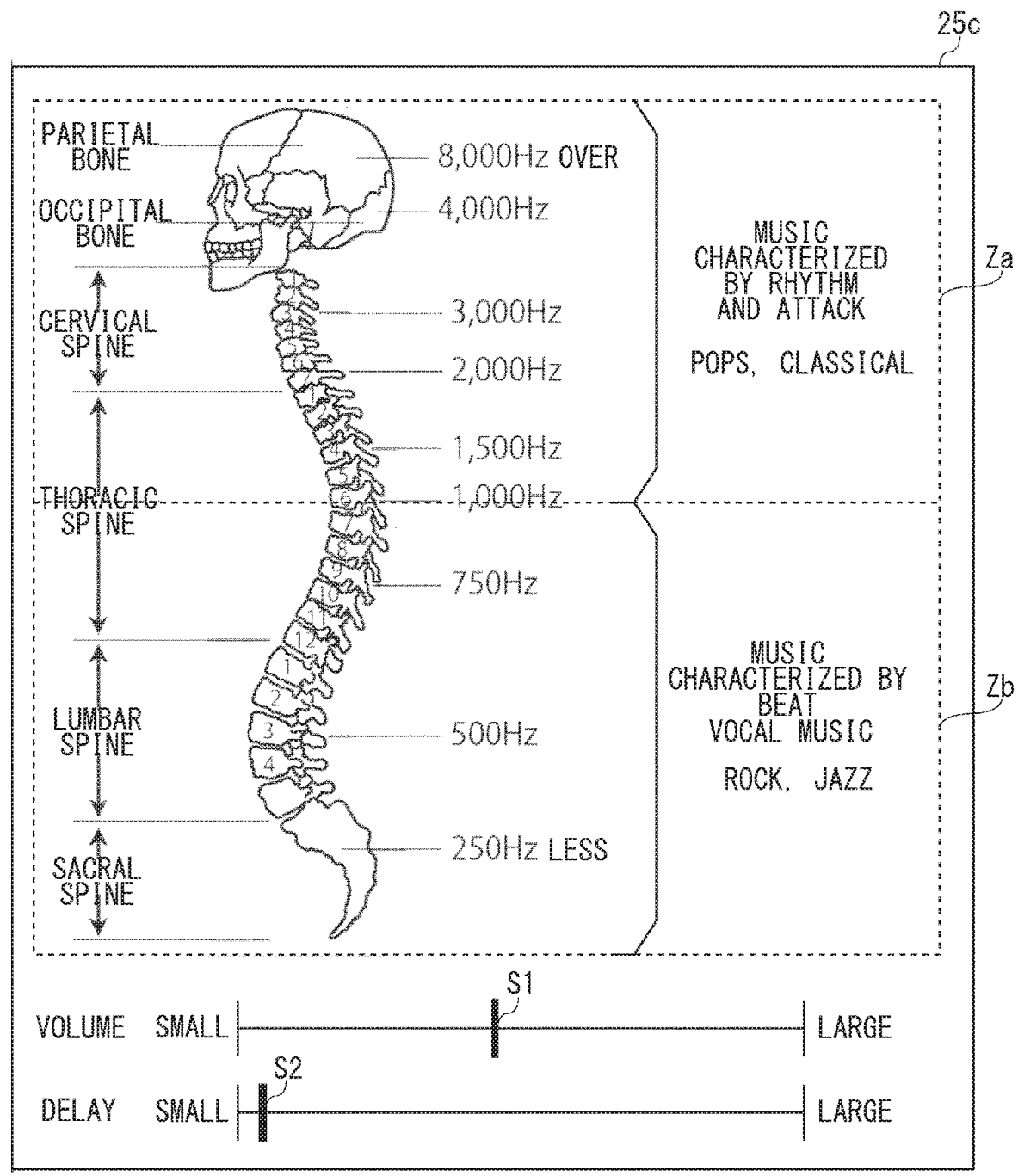
FIG. 4 shows the third example of a user operation screen displayed on the display interface.

FIG. 4 shows the third example of a user operation screen 25c displayed on the display interface 25. In the user operation screen 25c shown in FIG. 4, the frequency range desired to be enhanced by the vibrator 33 is organized according to music genre. Referring to FIG. 4, the frequency range is organized into two ranges including a range equal to higher than 1 kHz (A range) and a range below 1 kHz (B range). The user can select the range desired to be enhanced from the two ranges.

Referring to FIG. 4, music characterized by rhythm and attack, pops, classical are indicated as the music genre in the A range. It is indicated that the vibrator 33 should be fitted to a position corresponding to the range between the upper end of the skull bone and the center of the breastbone when the A range is selected. Music characterized by beat, vocal music, rock, and jazz are indicated as the music genre in the B range. It is indicated that the vibrator 33 should be fitted to a position corresponding to the range between the center of the breastbone and the lower end of the sacral spine when the B range is selected.

The user can select the A range by touching the zone Za in the user operation screen 25c corresponding to the A range and select the B range by touching the zone Zb corresponding to the B range.

The user operation screens 25a-25c shown in FIGS. 2-4 are byway of examples only, and the screen may have another format. For example, the screen may be formatted to allow the user to designate the upper limit and the lower limit of the frequency range desired to be enhanced, using specific numerical values.

Figure 5A:
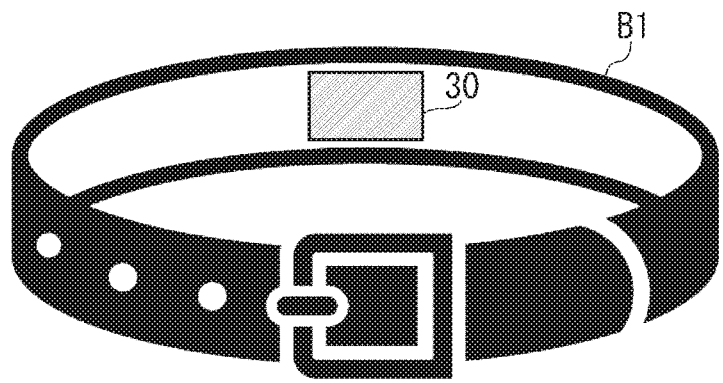
FIGS. 5A and 5B show specific examples of fitting the vibrator device.
Figure 5B:
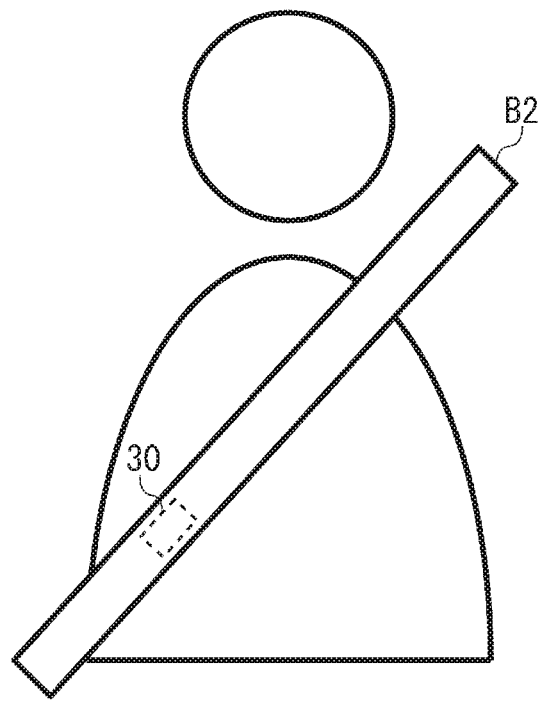

FIGS. 5A and 5B show specific examples of fitting the vibrator device 30. FIG. 5A shows an example in which the vibrator device 30 is fitted inside a belt B1 of an underwear or a skirt. The vibrator device 30 is plate-shaped, and the vibrating surface of the vibrator device 30 is fitted to and in contact with the human body. For example, the vibrator device 30 is housed in a simple case and is fixed inside the belt B1 by a clip. Alternatively, the back surface of the vibrator device 30 may be fixed inside the belt B1 by using a hook and loop fastener (e.g., a Velcro (registered trademark)). FIG. 5B shows a case in which the vibrator device 30 is fitted inside a seat belt B2. The shape and the method of fitting of the vibrator device 30 shown in FIGS. 5A and 5B are byway of examples only and are not limited to those shown in FIGS. 5A and 5B.

As described above, this embodiment enables enjoying a sense of realism and a sense of immersion that cannot be enjoyed with the earphone/headphone 40 alone, by fitting the vibrator 33 to a site other than the site fitted with the earphone/headphone 40. In other words, by driving the vibrator 33 with the music signal output from the preamplifier 22 and delivering the vibration to the human body, powerful music experience that accompanies a synergistic effect of the sound of the earphone/headphone 40 and the vibration can be realized.

Since the resonance of the body (bone) is utilized, the precision of the resonance frequency of the vibrator 33 is not required, and an experience of bass and a sense of realism can be felt not only by the ear but by the whole body. In the related-art vibrator with a built-in headphone, the resonance frequency and position of fitting of the vibrator are fixed. Therefore, vibration near the resonance frequency of the vibrator is unexceptionally large, making it difficult to obtain only the vibration in the range desired to be experienced.

In the vibration generation system 1 according to this embodiment, on the other hand, it is possible to limit the frequency range by means of the built-in variable filter 222, and it is possible to inhibit unnecessary music signals (vibration). In further accordance with the vibration generation system 1 according to this embodiment, the vibrator 33 can be fitted to a desired site of the body. In the case an experience of bass is desired, for example, the sense of realism can be improved by fitting the vibrator 33 to the waist.

Further, the range and volume of the music signal converted into vibration can be adjusted individually, and the time difference from the sound wave output from the earphone/headphone 40 can also be adjusted. Accordingly, flexible adjustment suited to personal preferences is possible so that the sense of immersion is further improved.

Further, the system can be used in combination with the existent music player 10 or the existent earphone/headphone 40 so that the cost of introducing the vibration generation system 1 incurred by the user is low, and existent resources can be utilized effectively. Further, visual presentation of the correspondence between the frequency range enhanced and the site of the body that should be fitted with the vibrator 33 allows the user to use the vibration generation system 1 according to this embodiment easily.

Figure 6:
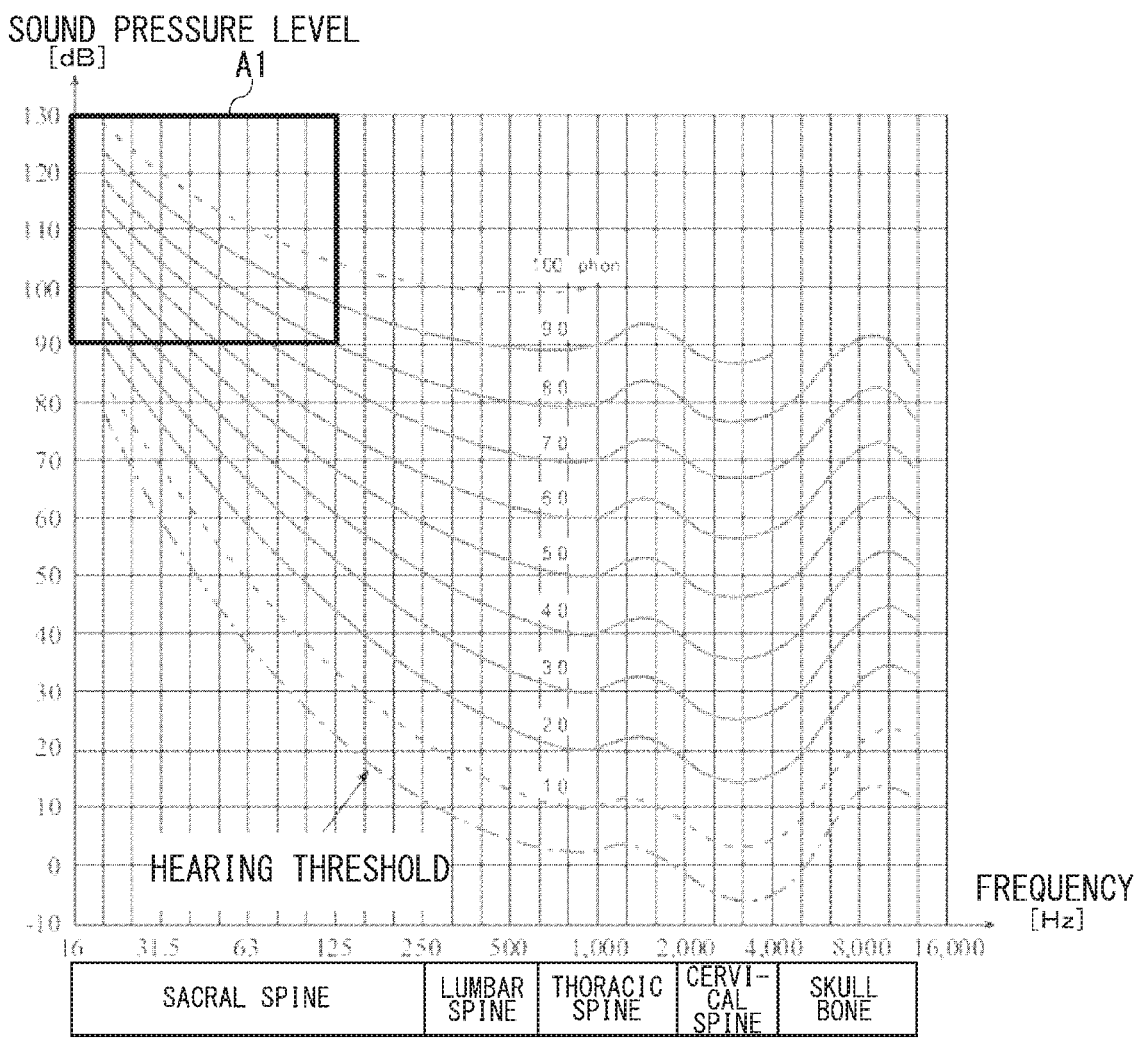
FIG. 6 is a graph showing an equal loudness curve.

The vibration generation system 1 according to this embodiment is also advantageous for the purpose of preventing difficulty in hearing. FIG. 6 is a graph showing an equal loudness curve. The equal loudness curve shown in FIG. 6 is an equal loudness curve standardized in ISO0226: 2003. An equal loudness level curve is a frequency characteristic curve created by connecting sound pressure levels sensed by the human ear to be of the same level as the frequency of sound is changed.

According to the guideline from Occupational Safety and Health Administration (OSHA), it is reported that exposure to excessively large sound for a long period of time may cause a damage to the ear and induce chronic noise-induced hearing loss (NIHL). The above guideline prescribes the duration for which people can be exposed to respective sound pressures without experiencing hearing loss as follows.

90 dB SPL 8 hours
95 dB SPL 4 hours
100 dB SPL 2 hours
105 dB SPL 1 hour
110 dB SPL 30 minutes
115 dB SPL 15 minutes
120 dB SPL to be avoided Normally, the human ear is most sensitive in 2 kHz-4 kHz. Therefore, a lot of users control the sound volume of a headphone etc. based on the sound in the 2 kHz-4 kHz range. Referring to FIG. 6, the sound pressure level at 2 kHz-4 kHz in the equal loudness curve for 80 phon is about 78 dB, and the sound pressure level at 125 Hz in the equal loudness curve for 80 phon is about 90 dB. The difference is about 12 dB. If the sound volume is controlled in the range 2 kHz-4 kHz based on the equal loudness curve for 80 phon, the ear will be exposed to a sound pressure exceeding 90 dB at 125 kHz or below. In this case, the danger of inducing hearing disorder is increased. As indicated in the above guideline, prolonged exposure of the ear to a sound pressure of 90 dB or higher (see an area A1 in FIG. 6) may carry the danger of inducing hearing disorder.

By switching (compensating) the sound in the area A1 to (with) the vibration produced by the vibrator 33, the reference line in the equal loudness curve can be lowered from 80 phon. With this, the user is expected to lower the overall sound volume of the headphone etc., and the likelihood that the user's ear is exposed to a sound pressure exceeding 90 dB can be reduced.

Described above is an explanation of the present invention based on an exemplary embodiment. The embodiment is intended to be illustrative only and it will be understood by those skilled in the art that various modifications to combinations of constituting elements and processes are possible and that such modifications are also within the scope of the present invention.

Figure 7:
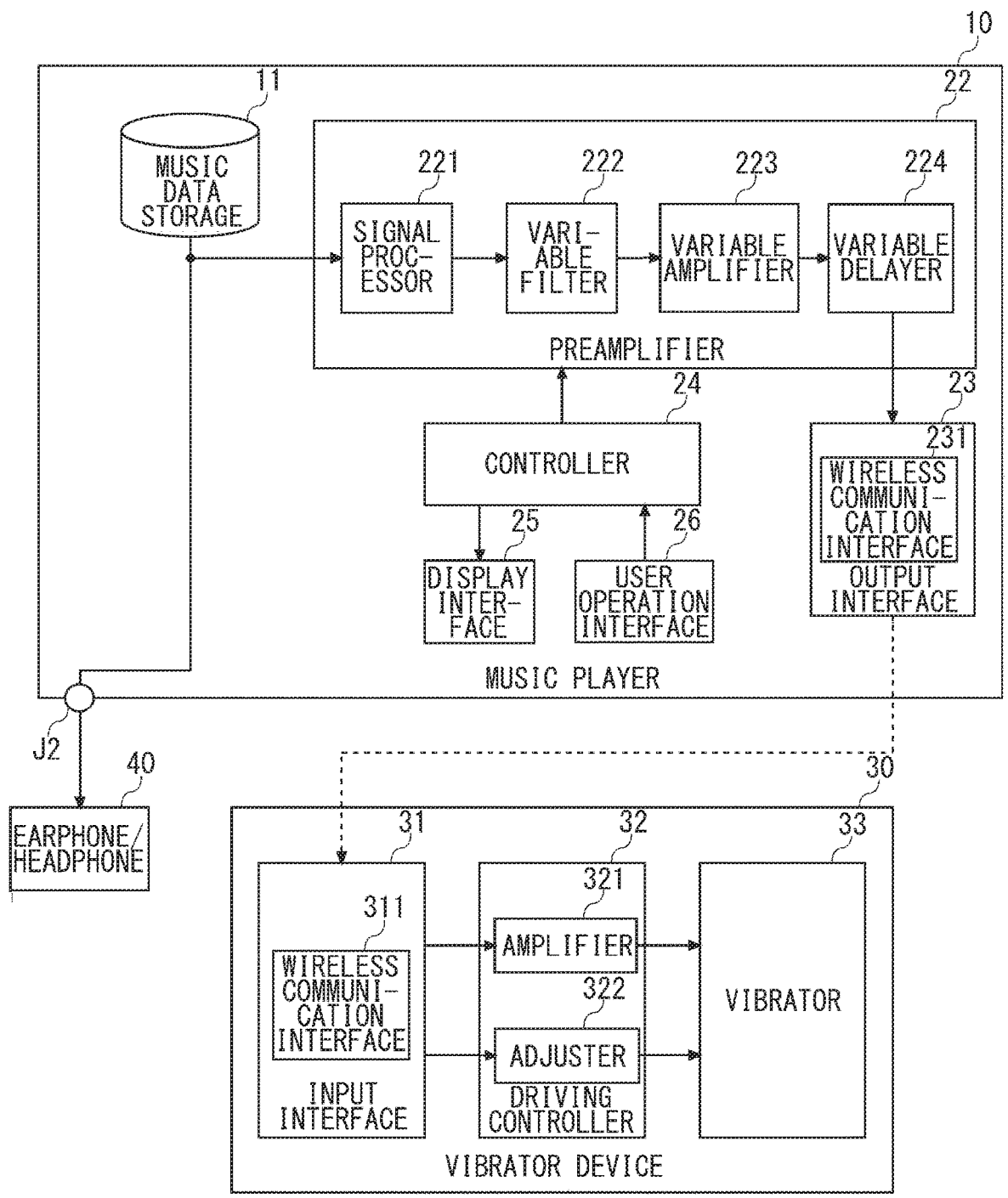
FIG. 7 is a block diagram showing a configuration of the vibration generation system according to variation 1.

FIG. 7 is a block diagram showing a configuration of the vibration generation system 1 according to variation 1. Variation 1 is configured such that the function of the signal generator 20 of the vibration generation system 1 shown in FIG. 1 is built in the music player 10. In the case that the music player 10 is a smartphone, for example, the system can be configured by installing an application program for implementing the function of the preamplifier 22 in digital signal processing. Alternatively, the music player 10 may be comprised of a special-purpose DAP in which the function of the preamplifier 22 is built in from the beginning. In variation 1, music data is directly supplied from a music data storage 11 to the preamplifier 22 in the music player 10 so that communication between the music player 10 and the signal generator 20 is unnecessary.

Figure 8:
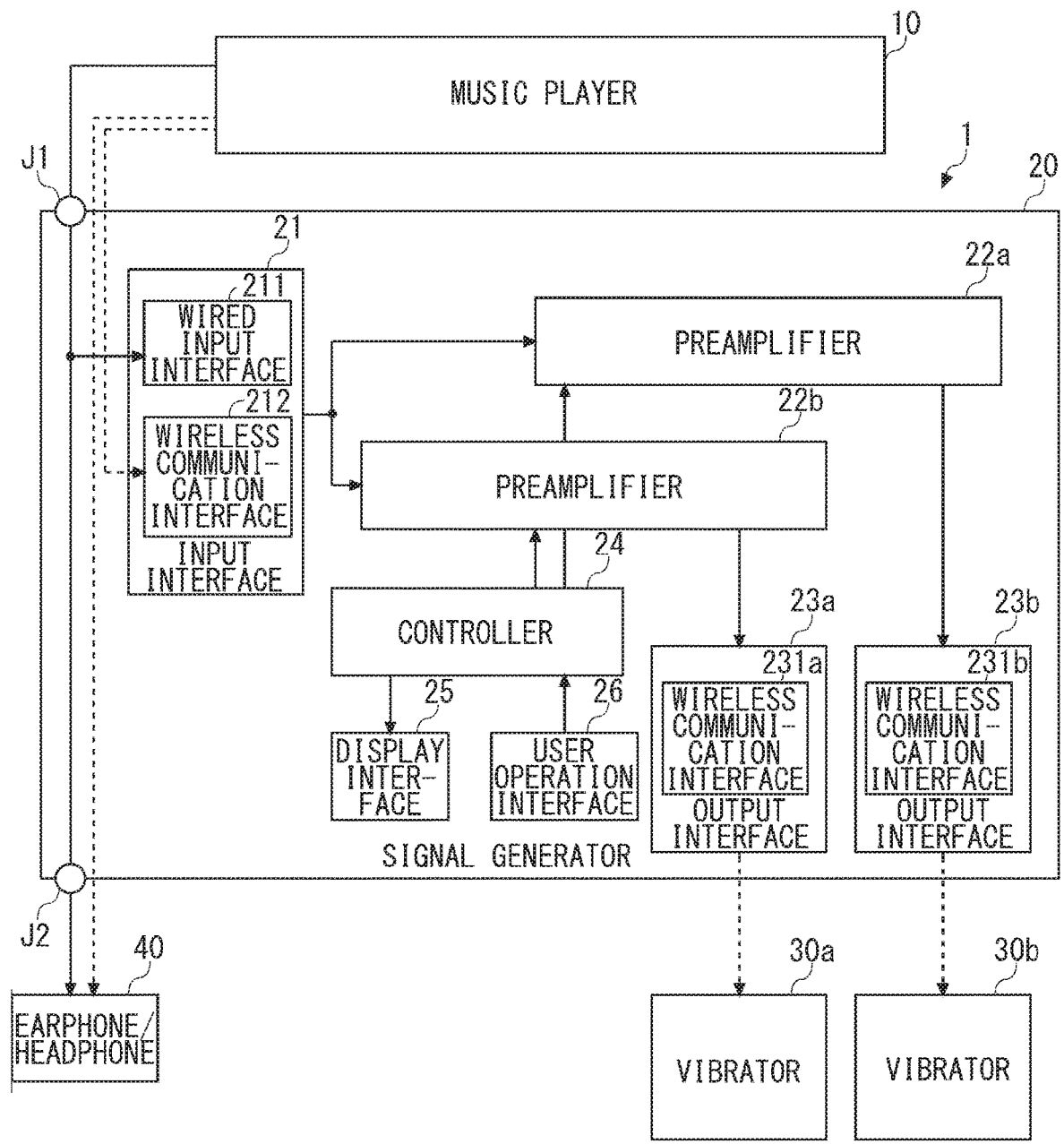
FIG. 8 is a block diagram showing a configuration of the vibration generation system according to variation 2.

FIG. 8 is a block diagram showing a configuration of the vibration generation system 1 according to variation 2. In variation 2, a plurality of vibrator devices 30a, 30b are used. Inside the signal generator 20 are provided a plurality of preamplifiers 22a, 22b and a plurality of output interfaces 23a, 23b corresponding to the plurality of vibrator devices 30a, 30b. It is difficult for a single vibrator 33 to cover vibration in a wide range. A more extensive range of vibration can be generated by providing the vibrator device 30a for low-range and the vibrator device 30b for high-range. In the case the plurality of vibrator devices 30a, 30b are provided, the devices are fitted to different sites of the human body in accordance with the respective extracted frequency range. The plurality of vibrator devices 30a, 30b may be comprised of the vibrator device 30a vibrated based on a left channel signal and the vibrator device 30b vibrated based on a right channel signal.

In the embodiment described above, an example is described in which the user manually sets the frequency range, volume, and time adjusted by the preamplifier 22. In the case the music player 10 or the signal generator 20 is connected to the internet, it is possible to acquire attribute information such as genre of music data to allow the controller to set the frequency range, volume, and time automatically. It is also possible to cause an AI engine (frequency determination interface) inside or outside the device to analyze a plurality of music signals, and at least one of the frequency range, volume, and time may be automatically adjusted based on the result of analysis and the music signals subjected to the analysis.

What is claimed is:

1. A vibration generation system comprising:
   a vibrator fitted to a human body for use;
   a variable filter that extracts a signal of a predefined frequency range from a music signal;
   a driver that drives the vibrator based on the signal of the predefined frequency range extracted by the variable filter;
   a user operation interface that adjusts the predefined frequency range; and
   a frequency determination interface that determines the predefined frequency range based on the music signal,
   wherein the user operation interface adjusts a time difference between a sound wave of the music signal transmitted to an ear of the human body and a vibration of the music signal transmitted from the vibrator to a bone of the human body.

2. The vibration generation system according to claim 1, further comprising:
   a display interface that displays a screen showing correspondence between the predefined frequency range and a site of the human body that should be fitted with the vibrator.

3. The vibration generation system according to claim 1, wherein
   the predefined frequency range is organized into groups according to music genre.

4. The vibration generation system according to claim 1, wherein
   the predefined frequency range that is predefined is organized into groups according to a characteristic of sound of a musical instrument and/or vocal performance.

5. The vibration generation system according to claim 1, further comprising:
   a variable amplifier provided in a stage that follows the variable filter, wherein the user operation interface adjusts a gain of the variable amplifier.

6. The vibration generation system according to claim 1, wherein
   a plurality of pairs of the vibrator and the variable filter are provided, and
   a plurality of vibrators are removably fit to different sites of the human body, respectively.

7. A signal generator connected by wire or wirelessly to a vibrator device including a vibrator fitted to a human body for use and a driver for driving the vibrator, the signal generator comprising:
   a variable filter that extracts a signal of a predefined frequency range from a music signal;

an output interface that outputs the signal of the predefined frequency range extracted by the variable filter to the vibrator device;
a user operation interface that adjusts the predefined frequency range; and
a frequency determination interface that determines the predefined frequency range based on the music signal, wherein
the user operation interface that adjusts a time difference between a sound wave of the music signal transmitted to an ear of the human body and a vibration of the music signal transmitted from the vibrator to a bone of the human body.

8. A vibrator device connected by wire or wirelessly to a signal generator including: a variable filter that extracts, from a music signal, a signal of a predefined frequency range, an output interface that outputs the signal of the predefined frequency range extracted by the variable filter, a user operation interface that adjusts the predefined frequency range, and a frequency determination interface that determines the predefined frequency range based on the music signal, wherein the user operation interface adjusts a time difference between a sound wave of the music signal transmitted to an ear of the human body and a vibration of the music signal transmitted from the vibrator device to a bone of the human body, the vibrator device comprising:
a vibrator fitted to a human body for use;
an input interface that acquires, from the signal generator, the signal of the predefined frequency range extracted by the variable filter; and
a driver that drives the vibrator based on the signal of the predefined frequency range extracted by the variable filter and inputted from the input interface.

* * * * *